United States Patent [19]

Myer

[11] Patent Number: 5,304,945
[45] Date of Patent: Apr. 19, 1994

[54] LOW-DISTORTION FEED-FORWARD AMPLIFIER

[75] Inventor: Robert E. Myer, Denville, N.J.

[73] Assignee: AT&T Bell Laboratories, Murray Hill, N.J.

[21] Appl. No.: 49,780

[22] Filed: Apr. 19, 1993

[51] Int. Cl.⁵ ............................................. H03F 1/32
[52] U.S. Cl. ................................... 330/149; 330/151
[58] Field of Search ............... 330/53, 107, 124 R, 330/149, 151

[56] References Cited

U.S. PATENT DOCUMENTS

| | | | |
|---|---|---|---|
| 3,815,040 | 6/1974 | Seidel | 330/149 |
| 3,873,936 | 3/1975 | Cho | 330/124 R |
| 4,146,844 | 3/1979 | Quinn | 330/149 |
| 4,480,105 | 10/1984 | Myer | 330/149 |
| 4,532,478 | 7/1985 | Silagi | 330/151 |
| 4,583,049 | 4/1986 | Powell | 330/151 |
| 4,743,859 | 5/1988 | Sosin | 330/54 |
| 4,812,779 | 3/1989 | Wagner | 330/149 |
| 4,916,407 | 4/1990 | Olver | 330/151 |
| 4,926,134 | 5/1990 | Olver | 330/2 |
| 4,943,783 | 7/1990 | Nojima et al. | 330/149 |
| 5,001,443 | 3/1991 | Martin | 333/26 |
| 5,023,565 | 6/1991 | Lieu | 330/151 |
| 5,077,532 | 12/1991 | Obermann et al. | 330/151 |
| 5,117,197 | 5/1992 | Hso et al. | 330/151 X |
| 5,166,634 | 11/1992 | Narahashi et al. | 330/151 |

Primary Examiner—Steven Mottola
Attorney, Agent, or Firm—Jason P. DeMont

[57] ABSTRACT

A low-distortion, high-power, feed-forward amplifier is disclosed which is particularly well-suited for cellular radio applications. An illustrative embodiment comprises a main amplifier and a pair of correction amplifiers, which each are used to eliminate different distortion products introduced by the main amplifier into the amplified signal.

8 Claims, 3 Drawing Sheets

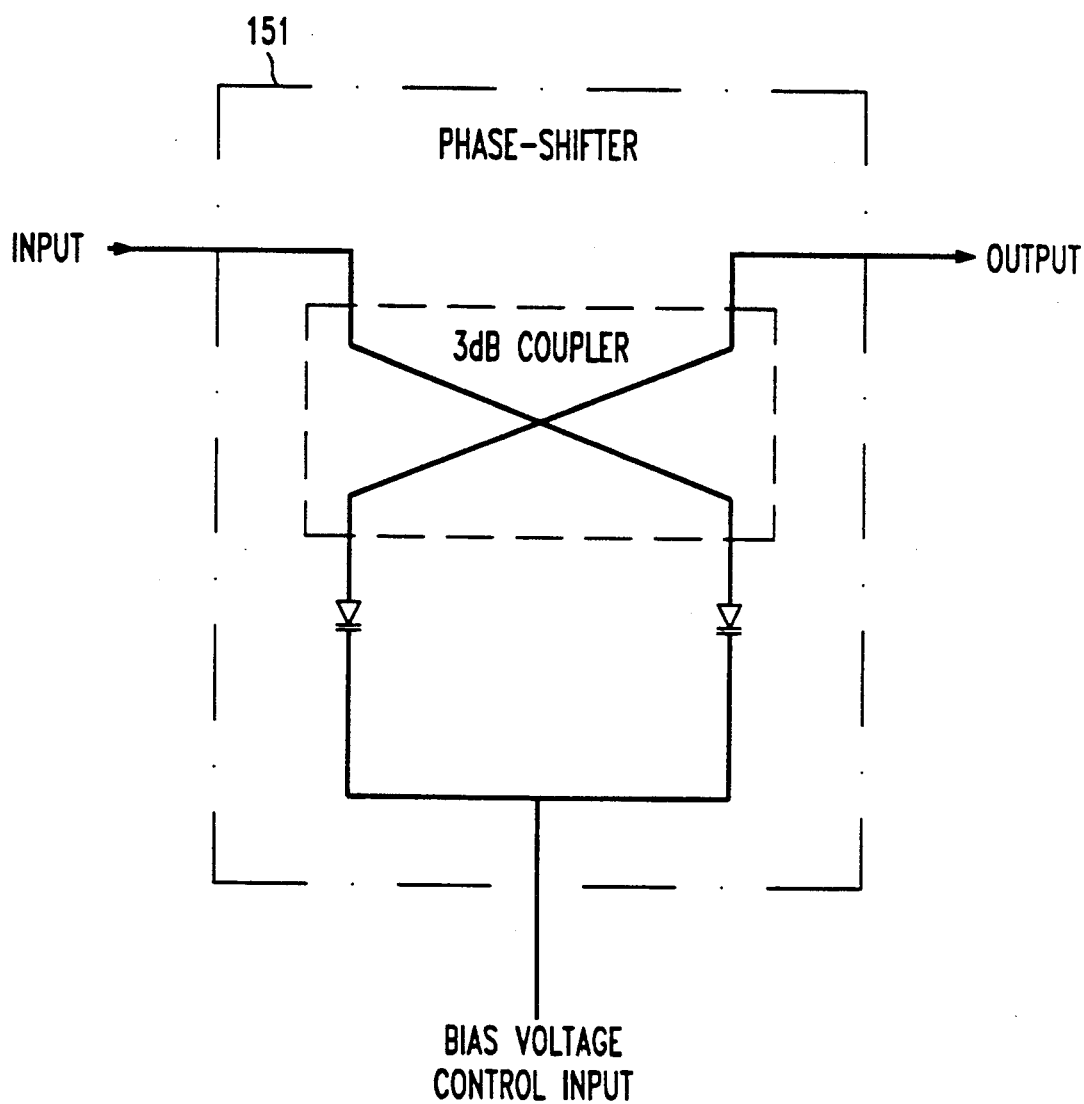

LOW-DISTORTION FEED-FORWARD AMPLIFIER

FIELD OF THE INVENTION

The present invention relates to electric circuit design in general, and more particularly, to methods and apparatus for amplifying an electric signal.

BACKGROUND OF THE INVENTION

It is often advantageous in electric circuits to amplify a complex signal having multiple sinusoidal components (i.e., a multi-tone signal) without introducing distortion products into the amplified signal. The physical characteristics of contemporary amplifiers are such, however, that amplifiers do, in fact, inject distortion into the signal, especially when high-power amplification is performed. Distortion reduction in high power multi-tone amplifiers can be achieved with feed-back, predistortion, and feed-forward mechanisms. At high frequencies feed-forward produces the most significant reduction in distortion.

SUMMARY OF THE INVENTION

Embodiments of the present invention are capable of amplifying a high frequency, complex signal having multiple sinusoidal components with low distortion while avoiding many of the costs and restrictions associated with prior techniques. Embodiments of the present invention are particularly advantageous in situations where an efficient amplifier is needed. These results are obtained in an illustrative embodiment of the present invention which comprises a main amplifier and a pair of correction amplifiers, each of which eliminate different distortion products introduced by the main amplifier into the amplified signal.

BRIEF DESCRIPTION OF THE DRAWING

FIG. 3 depicts a schematic diagram of an illustrative phase-shifter as shown in FIG. 1 and FIG. 2.

DETAILED DESCRIPTION

I. Introduction

Figure 1:
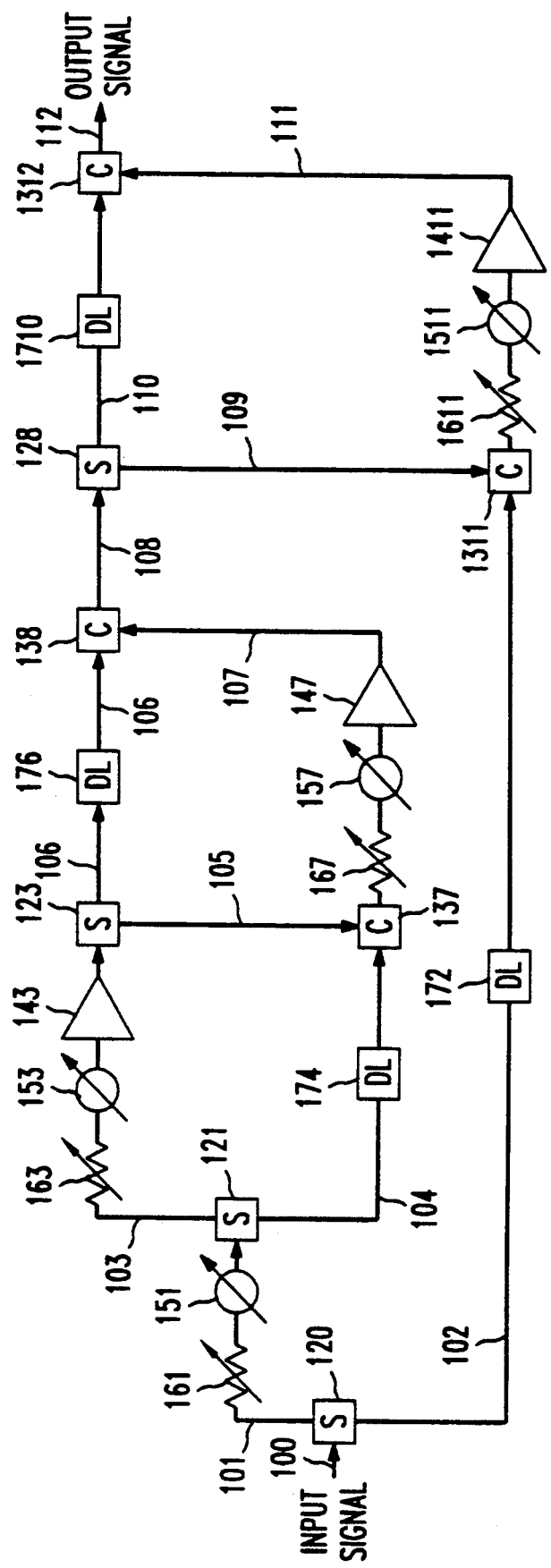
FIG. 1 shows a block diagram of an illustrative embodiment of the present invention.
Figure 2:
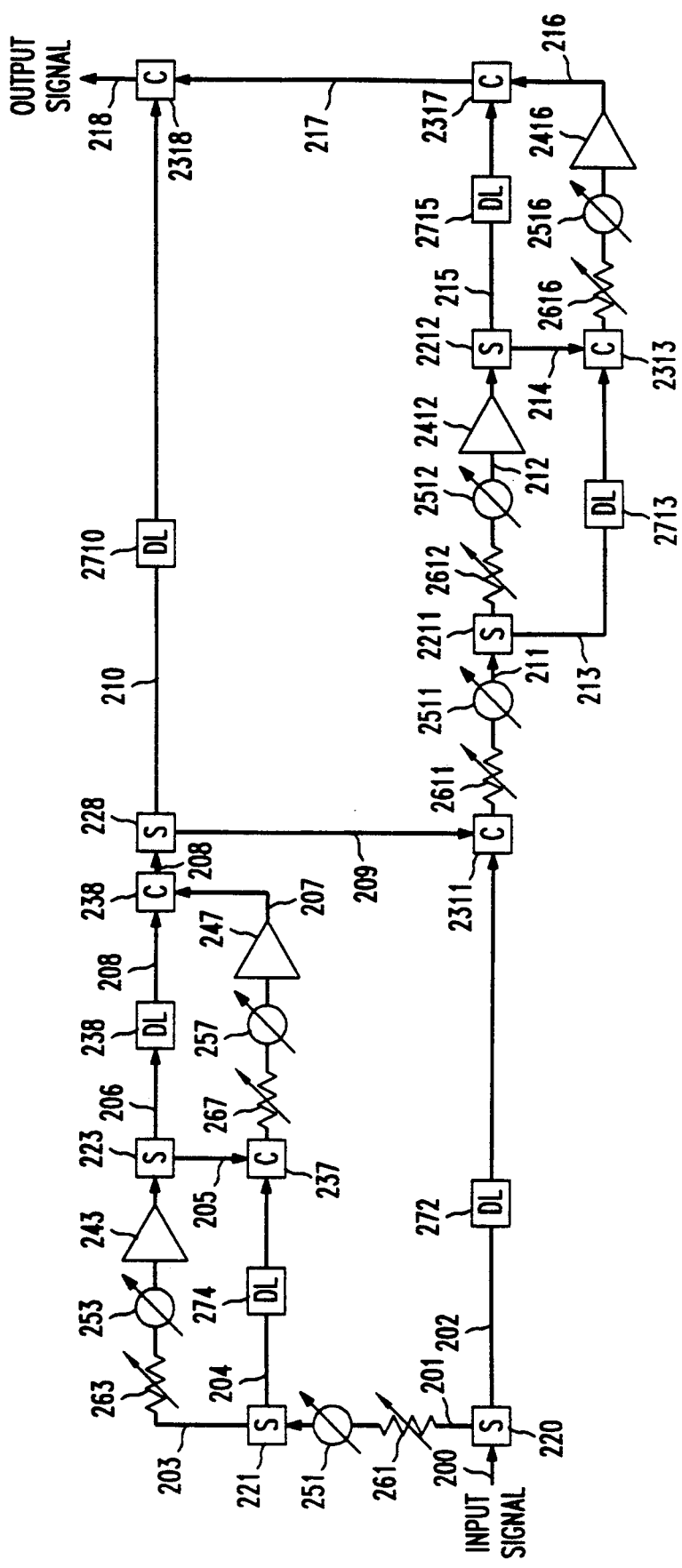
FIG. 2 depicts a block diagram of another illustrative embodiment of the present invention.

FIG. 1 and FIG. 2 each depict a schematic diagram of an illustrative embodiment of the present invention which receives and amplifies an input signal. The illustrative embodiments are particularly advantageous in situations where high power, low distortion amplification is desired. The first illustrative embodiment is discussed in the following section and the second illustrative embodiment is described in the third section.

II. The First Illustrative Embodiment

The illustrative embodiment shown in FIG. 1 advantageously comprises: splitter 120, splitter 121, splitter 123, splitter 128, combiner 137, combiner 138, combiner 1311, combiner 1312, amplifier 143, amplifier 147, amplifier 1411, phase-shifter 151, phase-shifter 153, phase-shifter 157, phase-shifter 1511, attenuator 161, attenuator 163, attenuator 167, attenuator 1611, delay line 172, delay line 174, delay line 176 and delay line 1710.

While in the illustrative embodiment splitter 120 and splitter 121 advantageously comprise a 3 dB Wilkinson coupler, it will be clear to those skilled in the art how to make and use embodiments of the present invention in which either or both of splitter 120 and splitter 121 are directional couplers, hybrid couplers, or any other device which is capable of creating two or more signals from a single signal.

While it is preferred that splitter 123 and splitter 128 advantageously comprise a 30 dB directional coupler, it will be clear to those skilled in the art how to make and use embodiments of the present invention in which either or both of splitter 123 and splitter 128 are Wilkinson couplers, hybrid couplers, or any other device which is capable of creating two or more signals from a single signal.

While in the illustrative embodiment combiner 137 and combiner 1311 advantageously comprise a 3 dB Wilkinson coupler for combining their respective inputs in phase, it will be clear to those skilled in the art how to make and use embodiments of the present invention in which either or both of combiner 137 and combiner 1311 are directional couplers, hybrid couplers, or any other device which is capable of creating a single signal based on the sum of two or more input signals.

Combiner 138 and combiner 1312 advantageously comprise 10 dB directional couplers but it will be clear to those skilled in the art how to make and use embodiments of the present invention in which either or both of combiner 138 and combiner 1312 are hybrid couplers, Wilkinson couplers, or any other device which is capable of creating a single signal based on the sum or two or more input signal.

Amplifier 143 is advantageously a class A or class A/B amplifier with a gain of at least 30 dB. It will be clear to those skilled in the art that amplifier 143 can be fabricated from commonly available linear amplifiers. Amplifier 147 and amplifier 1411 are advantageously class A or class A/B amplifiers with a gain of at least 40 dB. The gain of amplifier 147 is preferably equal to the loss associated with splitter 123, combiner 137, attenuator 167, phase-shifter 157 and coupler 138, (i.e., if the aggregate loss is 40 dB, then the gain of amplifier 147 should be 40 dB), and the gain of amplifier 1411 is preferably equal to the aggregate loss associated with splitter 128, combiner 1311, attenuator 1611, phase-shifter 1511, and coupler 1312.

Phase-shifter 151, phase-shifter 153, phase-shifter 157 and phase-shifter 1511 each preferably comprise, as shown in FIG. 3, a 3 dB coupler and two back-biased varactor diodes. The phase-shift imparted to the signal passing through the phase-shifter can be controlled by varying the back-bias of the varactor diodes. It will be clear to those skilled in the art that each of phase-shifter 151, phase-shifter 153, phase-shifter 157 and phase-shifter 1511 can be fabricated easily or readily purchased off-the-shelf.

Attenuator 161, attenuator 163, attenuator 167, and attenuator 1611 are preferably identical (i.e., non-reflective matched impedance on both ports on all settings) and advantageously attenuate (i.e., negative gain) or pass through (i.e., zero gain) a signal placed on their respective input. It is preferred that the phases of the attenuators be equal although it will be clear to those skilled in the art how to make and use embodiments of the present invention in which they are not. It is preferred that the respective gain of each of the attenuators be continuously variable in response to a gain control signal. It will be clear to those skilled in the art that each of attenuator 161, attenuator 163, attenuator 167 and attenuator 1611 can be fabricated in many ways using commercially available components (e.g., a voltage controlled amplifier, a voltage controlled attenuator, a current controlled amplifier, a current controlled attenuator, etc.). See R. Waugh, "A Low Cost Surface Mount PIN Diode π Attenuator," *Microwave Journal,* 280–284 (May 1992).

Delay line 172, delay line 174, delay line 176 and delay line 1710 are advantageously fabricated from lengths of coaxial cable. From the following description it will be clear to those skilled in the art how to fabricated the appropriate delay lines.

The illustrative embodiment in FIG. 1 advantageously functions as follows. Splitter 120 advantageously receives on signal path 100 a complex signal having multiple sinusoidal components (i.e., a multitone signal), an RMS amplitude and phase defined as zero. Splitter 120 creates a first signal on signal path 101 and a second signal on signal path 102 based on the input signal such that both the first signal and the second signal are analog representations of the input signal. While it is preferred that the first signal and the second signal be endowed with equal amplitude and phase, it will be clear to those skilled in the art how to make and use embodiments of the present invention in which the first signal and second signal are not created with equal amplitudes or equal phases.

Attenuator 161 lies in signal path 101 and preferably modifies the amplitude of the first signal so that the amplitudes of the second signal on signal path 102 and the ninth signal on signal path 109 are equal upon being added in combiner 1311. It will be clear to those skilled in the art that attenuator 161 can be subsumed into splitter 120.

Phase-shifter 151 also lies in signal path 101 and preferably modifies the phase of the first signal so that the phases of the second signal on signal path 102 and the ninth signal on signal path 109 are opposite upon being added in combiner 1311. It will be clear to those skilled in the art that attenuator 161 and phase-shifter 151 can lie in signal path 101 in any order. It will also be clear to those skilled in the art that attenuator 161 and phase-shifter 151 can lie in signal path 102 instead of signal path 101.

Splitter 121 advantageously receives the first signal from signal path 101 and creates a third signal on signal path 103 and a fourth signal on signal path 104 such that both the third signal and the fourth signal are analog representations of the input signal. While it is preferred that the third signal and the fourth signal be endowed with equal amplitude and phase by splitter 121, it will be clear to those skilled in the art how to make and use embodiments of the present invention in which the first signal and second signal are not created with equal amplitudes or phases.

Attenuator 163 lies in signal path 103 and preferably modifies the amplitude of the third signal so that the amplitudes of the fourth signal on signal path 104 and the fifth signal on signal path 105 are equal upon being added in combiner 137. It will be clear to those skilled in the art that attenuator 163 can be subsumed into splitter 121.

Phase-shifter 153 also lies in signal path 103 and preferably modifies the phase of the third signal so that the phases of the fourth signal on signal path 104 and the fifth signal on signal path 105 are opposite upon being added in combiner 137. It will also be clear to those skilled in the art that attenuator 163 and phase-shifter 153 can lie in signal path 104 instead of signal path 103.

Amplifier 143 lies in signal path 103 and preferably amplifies the third signal at least 30 dB. It is understood that amplifier 143 is imperfect and introduces distortion products into the output. It will be clear to those skilled in the art that amplifier 143, attenuator 163 and phase-shifter 153 can lie in signal path 103 in any order, but that it is disadvantageous for either attenuator 163 or phase-shifter 153 to lie after amplifier 143.

Splitter 123 advantageously receives the third signal from signal path 103 and creates a fifth signal on signal path 105 and a sixth signal on signal path 106 such that both the fifth signal and the sixth signal are analog representations of the third signal. While it is advantageous that the fifth signal have an amplitude of 30 dB or less lower than the amplitude of the sixth signal, it will be clear to those skilled in the art how to make and use embodiments of the present invention in which the fifth signal is other than 30 dB less the sixth signal.

Delay line 174 lies in signal path 104 and preferably delays the fourth signal for the same duration as the third signal is delayed on signal path 104 and the fifth signal is delayed on signal path 105 so that the fourth signal on signal path 104 and the fifth signal on signal path 105 arrive at combiner 137 at exactly the same time.

Combiner 137 receives the fourth signal from signal path 104 and the fifth signal from signal path 105 and preferably adds them in opposite phase and outputs the sum as the seventh signal on signal path 107. It is preferred that attenuator 164, phase-shifter 154 and delay-line 174 be tuned so that the seventh signal is an analog representation of the distortion products introduced into the third signal by amplifier 141 and does not contain any representation of the input signal on signal path 100.

Attenuator 167 lies in signal path 107 and preferably modifies the amplitude of the seventh signal so that the amplitudes of the sixth signal on signal path 106 and the seventh signal on signal path 107 are equal upon being added in combiner 138. It will be clear to those skilled in the art that attenuator 167 can be subsumed into combiner 137.

Phase-shifter 157 also lies in signal path 107 and preferably modifies the phase of the seventh signal so that the phases of the sixth signal on signal path 106 and the seventh signal on signal path 107 are opposite upon being added in combiner 138. It will also be clear to those skilled in the art that attenuator 167 and phase-shifter 157 can lie in signal path 106 instead of signal path 107.

Amplifier 147 lies in signal path 107 and preferably amplifies the third signal at least 40dB. It will be clear to those skilled in the art that amplifier 147, attenuator 167 and phase-shifter 157 can lie in signal path 107 in any order.

Delay line 176 lies in signal path 106 and preferably delays the sixth signal for the same duration as the fifth signal is delayed on signal path 105 and the seventh signal is delayed on signal path 107 so that the sixth signal on signal path 106 and the seventh signal on signal path 107 arrive at combiner 138 at exactly the same time.

Combiner 138 receives the sixth signal from signal path 106 and the seventh signal from signal path 107, adds them in opposite phase and outputs the sum as the eighth signal on signal path 108. It is preferred that attenuator 167, phase-shifter 157 and delay-line 176 be tuned so that the eighth signal is an analog representation of the input signal with the majority of the distortion products introduced by amplifier 143 canceled by the seventh signal.

Splitter 128 advantageously receives the eighth signal from signal path 108 and creates a ninth signal on signal path 109 and a tenth signal on signal path 110 such that both the ninth signal and the tenth signal are analog representations of the eighth signal. While it is advantageous that the ninth signal have an amplitude of 30dB or less lower than the amplitude of the tenth signal, it will be clear to those skilled in the art how to make and use embodiments of the present invention in which the ninth signal is not 30dB less than the tenth signal.

Delay line 172 lies in signal path 102 and preferably delays the second signal for the same duration as the delay of the first signal on signal path 101 plus the delay of the third signal on signal path 103 plus the delay of the sixth signal on signal path 106, plus the delay of the eighth signal on signal path 108 and the delay of the ninth signal on signal path 109 so that the second signal on signal path 102 and the ninth signal on signal path 109 arrive at combiner 1311 at exactly the same time.

Combiner 1311 receives the second signal from signal path 102 and the ninth signal from signal path 109 and preferably adds them in opposite phase and outputs the sum as the eleventh signal on signal path 111. It is preferred that attenuator 161, phase-shifter 151 and delay-line 172 be tuned so that the eleventh signal is an analog representation of the distortion products remaining in the tenth signal and does not contain any representation of the input signal on signal path 100.

Attenuator 1611 lies in signal path 111 and preferably modifies the amplitude of the eleventh signal so that the amplitudes of the tenth signal on signal path 110 and the eleventh signal on signal path 111 are equal upon being added in combiner 1312. It will be clear to those skilled in the art that attenuator 1611 can be subsumed into combiner 1311.

Phase-shifter 1511 also lies in signal path 111 and preferably modifies the phase of the eleventh signal so that the phases of the tenth signal on signal path 111 and the eleventh signal on signal path 111 are opposite upon being added in combiner 1312. It will also be clear to those skilled in the art that attenuator 1611 and phase-shifter 1511 can lie in signal path 110 instead of signal path 111.

Amplifier 1411 lies in signal path 111 and preferably amplifies the eighth signal at least 40dB. It will be clear to those skilled in the art that amplifier 1411, attenuator 1611 and phase-shifter 1511 can lie in signal path 111 in any order.

Delay line 1710 lies in signal path 110 and preferably delays the tenth signal for the same duration as the ninth signal is delayed on signal path 109 and the eleventh signal is delayed on signal path 111 so that the tenth signal on signal path 110 and the eleventh signal on signal path 111 arrive at combiner 1312 at exactly the same time.

Combiner 1312 receives the tenth signal from signal path 110 and the eleventh signal from signal path 111, adds them in opposite phase and outputs the sum as the output signal on signal path 112. It is preferred that attenuator 1611, phase-shifter 1511 and delay-line 1710 be tuned so that the output signal is an analog representation of the input signal with the vast majority of the distortion products introduced by amplifier 143 canceled by the eleventh signal.

II. The Second Illustrative Embodiment

The illustrative embodiment shown in FIG. 2 advantageously comprises: splitter 220, splitter 221, splitter 223, splitter 228, splitter 2211, splitter 2212, combiner 237, combiner 238, combiner 2311, combiner 2316, combiner 2317, combiner 2318, amplifier 243, amplifier 247, amplifier 2412, amplifier 2416, phase-shifter 251, phase-shifter 253, phase-shifter 257, phase-shifter 2511, phase-shifter 2512, phase-shifter 2516, attenuator 261, attenuator 263, attenuator 267, attenuator 2611, attenuator 2612, attenuator 2616, delay line 272, delay line 274, delay line 276, delay line 2710, delay line 2713 and delay line 2715.

In the illustrative embodiment splitter 220, splitter 221 and splitter 2211 advantageously comprise a 3dB Wilkinson coupler. It will be clear to those skilled in the art how to make and use embodiments of the present invention in which any or all of splitter 220, splitter 221 and splitter 2211 are directional couplers, hybrid couplers, or any other device which is capable of creating two or more signals from a single signal.

While it is preferred that splitter 223, splitter 228 and splitter 2212 advantageously comprise a 30dB directional coupler, it will be clear to those skilled in the art how to make and use embodiments of the present invention in which any or all of splitter 223, splitter 228 and splitter 2212 are Wilkinson couplers, hybrid couplers, or any other device which is capable of creating two or more signals from a single signal.

While in the illustrative embodiment combiner 237, combiner 2311 and combiner 2316 advantageously comprise a 3dB Wilkinson coupler for combining their respective inputs in phase, it will be clear to those skilled in the art how to make and use embodiments of the present invention in which any or all of combiner 237, combiner 2311 and combiner 2316 are directional couplers, hybrid couplers, or any other device which is capable of creating a single signal based on the sum of two or more input signals.

Combiner 238, combiner 2312 and combiner 2317 advantageously comprise 10dB directional couplers but it will be clear to those skilled in the art how to make and use embodiments of the present invention in which any or all of combiner 238, combiner 2312 and combiner 2317 are hybrid couplers, Wilkinson couplers, or any other device which is capable of creating a single signal based on the sum or two or more input signals.

Amplifier 243 is advantageously a class A or class A/B amplifier with a gain of at least 30dB. It will be clear to those skilled in the art that amplifier 243 can be fabricated from commonly available linear amplifiers. Amplifier 247, amplifier 2412 and amplifier 2416 are advantageously a class A amplifiers or class A/B amplifiers with a gain of at least 40dB.

Phase-shifter 251, phase-shifter 253, phase-shifter 257, phase-shifter 2511, phase-shifter 2512, and phase-shifter 2516 each preferably comprise, as shown in FIG. 3, a 3dB coupler and two back-biased varactor diodes. It will be clear to those skilled in the art that each of phase-shifter 251, phase-shifter 253, phase-shifter 257, phase-shifter 2511, phase-shifter 2512, and phase-shifter 2516 can be fabricated easily or readily purchased off-the-shelf.

Attenuator 261, attenuator 263, attenuator 267, attenuator 2611, attenuator 2612 and attenuator 2616 are preferably identical (i.e., non-reflective matched impedance on both ports on all settings) and advantageously attenuate (i.e., negative gain) or pass through (i.e., zero gain) a signal placed on their respective input. It is preferred that the phases of the attenuators be equal although it will be clear to those skilled in the art how to make and use embodiments of the present invention in which they are not. It is preferred that the respective gain of each of the attenuators be continuously variable in response to a gain control signal. It will be clear to those skilled in the art that each attenuator can be fabricated in many ways using commercially available components (e.g., a voltage controlled amplifier, a voltage controlled attenuator, a current controlled amplifier, a current controlled attenuator, etc.). See R. Waugh, "A Low Cost Surface Mount PIN Diode $\pi$ Attenuator,'-'Microwave Journal, 280–284 (May 1992).

Delay line 272, delay line 274, delay line 276, delay line 2710, delay line 2713 and delay line 2715 are advantageously fabricated from lengths of coaxial cable. From the following description it will be clear to those skilled in the art how to fabricated the appropriate delay lines.

The illustrative embodiment in FIG. 2 advantageously functions as follows. Splitter 220 advantageously receives on signal path 200 a complex signal having multiple sinusoidal components (i.e., a multitone signal), an RMS amplitude and phase defined as zero. Splitter 220 creates a first signal on signal path 201 and a second signal on signal path 202 based on the input signal such that both the first signal and the second signal are analog representations of the input signal. While it is preferred that the first signal and the second signal be endowed with equal amplitude and phase, it will be clear to those skilled in the art how to make and use embodiments of the present invention in which the first signal and second signal are not created with equal amplitudes.

Attenuator 261 lies in signal path 201 and preferably modifies the amplitude of the first signal so that the amplitudes of the second signal on signal path 202 and the ninth signal on signal path 209 are equal upon being added in combiner 2311. It will be clear to those skilled in the art that attenuator 261 can be subsumed into splitter 220.

Phase-shifter 251 also lies in signal path 201 and preferably modifies the phase of the first signal so that the phases of the second signal on signal path 202 and the ninth signal on signal path 209 are opposite upon being added in combiner 2311. It will be clear to those skilled in the art that attenuator 261 and phase-shifter 251 can lie in signal path 201 in any order. It will also be clear to those skilled in the art that attenuator 261 and phase-shifter 251 can lie in signal path 202 instead of signal path 201.

Splitter 221 advantageously receives the first signal from signal path 201 and creates a third signal on signal path 203 and a fourth signal on signal path 204 such that both the third signal and the fourth signal are analog representations of the input signal. While it is preferred that the third signal and the fourth signal be endowed with equal amplitude and phase by splitter 221, it will be clear to those skilled in the art how to make and use embodiments of the present invention in which the first signal and second signal are not created with equal amplitudes or phases.

Attenuator 263 lies in signal path 203 and preferably modifies the amplitude of the third signal so that the amplitudes of the fourth signal on signal path 204 and the fifth signal on signal path 205 are equal upon being added in combiner 237. It will be clear to those skilled in the art that attenuator 263 can be subsumed into splitter 221.

Phase-shifter 253 also lies in signal path 203 and preferably modifies the phase of the third signal so that the phases of the fourth signal on signal path 204 and the fifth signal on signal path 205 are opposite upon being added in combiner 237. It will also be clear to those skilled in the art that attenuator 263 and phase-shifter 253 can lie in signal path 204 instead of signal path 203.

Amplifier 243 lies in signal path 203 and preferably amplifies the third signal at least 30dB. It is understood that amplifier 243 is imperfect and introduces distortion products into the output. It will be clear to those skilled in the art that amplifier 243, attenuator 263 and phase-shifter 253 can lie in signal path 203 in any order.

Splitter 223 advantageously receives the third signal from signal path 203 and creates a fifth signal on signal path 205 and a sixth signal on signal path 206 such that both the fifth signal and the sixth signal are analog representations of the third signal. While it is advantageous that the fifth signal have the same phase as the sixth signal, and have an amplitude of 30dB or less lower than the amplitude of the sixth signal, it will be clear to those skilled in the art how to make and use embodiments of the present invention in which the fifth signal is not 30dB less than the sixth signal.

Delay line 274 lies in signal path 204 and preferably delays the fourth signal for the same duration as the third signal is delayed on signal path 204 and the fifth signal is delayed on signal path 205 so that the fourth signal on signal path 204 and the fifth signal on signal path 205 arrive at combiner 237 at exactly the same time.

Combiner 237 receives the fourth signal from signal path 204 and the fifth signal from signal path 205 and preferably adds them in opposite phase and outputs the sum as the seventh signal on signal path 207. It is preferred that attenuator 264, phase-shifter 254 and delay-line 274 be tuned so that the seventh signal is an analog representation of the distortion products introduced into the third signal by amplifier 241 and does not contain any representation of the input signal on signal path 200.

Attenuator 267 lies in signal path 207 and preferably modifies the amplitude of the seventh signal so that the amplitudes of the sixth signal on signal path 206 and the seventh signal on signal path 207 are equal upon being added in combiner 238. It will be clear to those skilled in the art that attenuator 267 can be subsumed into combiner 237.

Phase-shifter 257 also lies in signal path 207 and preferably modifies the phase of the seventh signal so that the phases of the sixth signal on signal path 207 and the seventh signal on signal path 207 are opposite upon being added in combiner 238. It will also be clear to those skilled in the art that attenuator 267 and phase-shifter 257 can lie in signal path 206 instead of signal path 207.

Amplifier 247 lies in signal path 207 and preferably amplifies the third signal at least 10dB. It will be clear to those skilled in the art that amplifier 247, attenuator 267 and phase-shifter 257 can lie in signal path 207 in any order.

Delay line 276 lies in signal path 206 and preferably delays the sixth signal for the same duration as the fifth signal is delayed on signal path 205 and the seventh signal is delayed on signal path 207 so that the sixth signal on signal path 206 and the seventh signal on signal path 207 arrive at combiner 238 at exactly the same time.

Combiner 238 receives the sixth signal from signal path 206 and the seventh signal from signal path 207, adds them in opposite phase and outputs the sum as the eighth signal on signal path 208. It is preferred that attenuator 267, phase-shifter 257 and delay-line 276 be tuned so that the eighth signal is an analog representation of the input signal with the majority of the distortion products introduced by amplifier 243 canceled by the seventh signal.

Splitter 228 advantageously receives the eighth signal from signal path 208 and creates a ninth signal on signal path 209 and a tenth signal on signal path 210 such that both the ninth signal and the tenth signal are analog representations of the eighth signal. While it is advantageous that the ninth signal have an amplitude of 30dB or less lower than the amplitude of the tenth signal, it will be clear to those skilled in the art how to make and use embodiments of the present invention in which the ninth signal is not 30dB less than the tenth signal.

Delay line 272 lies in signal path 202 and preferably delays the second signal for the same duration as the delay of the first signal on signal path 201 plus the delay of the third signal on signal path 203 plus the delay of the sixth signal on signal path 206, plus the delay of the eighth signal on signal path 208 and the delay of the ninth signal on signal path 209 so that the second signal on signal path 202 and the ninth signal on signal path 209 arrive at combiner 2311 at exactly the same time.

Combiner 2311 receives the second signal from signal path 202 and the ninth signal from signal path 209 and preferably adds them in opposite phase and outputs the sum as the eleventh signal on signal path 211. It is preferred that attenuator 261, phase-shifter 251 and delay-line 272 be tuned so that the eleventh signal is an analog representation of the distortion products remaining in the tenth signal and does not contain any representation of the input signal on signal path 200.

Attenuator 2611 lies in signal path 211 and preferably modifies the amplitude of the eleventh signal so that the amplitudes of the tenth signal on signal path 210 and the seventeenth signal on signal path 217 are equal upon being added in combiner 2318. It will be clear to those skilled in the art that attenuator 2611 can be subsumed into combiner 2311.

Phase-shifter 2511 also lies in signal path 211 and preferably modifies the phase of the eleventh signal so that the phases of the tenth signal on signal path 211 and the seventeenth signal on signal path 217 are opposite upon being added in combiner 2318. It will also be clear to those skilled in the art that attenuator 2611 and phase-shifter 2511 can lie in signal path 210 instead of signal path 211.

Splitter 2211 receives the eleventh signal from signal path 211 and creates a twelfth signal on signal path 212 and a thirteenth signal on signal path 213 based on the eleventh signal such that both the twelfth signal and the thirteenth signal are analog representations of the eleventh signal. While it is preferred that the twelfth signal and the thirteenth signal be endowed with equal amplitude and phase, it will be clear to those skilled in the art how to make and use embodiments of the present invention in which the twelfth signal and thirteenth signal are not created with equal amplitudes.

Attenuator 2612 lies in signal path 212 and preferably modifies the amplitude of the twelfth signal so that the amplitudes of the thirteenth signal on signal path 213 and the fourteenth signal on signal path 214 are equal upon being added in combiner 2316. It will be clear to those skilled in the art that attenuator 2612 can be subsumed into splitter 2211.

Phase-shifter 2512 also lies in signal path 212 and preferably modifies the phase of the twelfth signal so that the phases of the thirteenth signal on signal path 213 and the fourteenth signal on signal path 214 are opposite upon being added in combiner 2316. It will be clear to those skilled in the art that attenuator 2612 and phase-shifter 2512 can lie in signal path 212 in any order. It will also be clear to those skilled in the art that attenuator 2612 and phase-shifter 2512 can lie in signal path 213 or signal path 214 instead of signal path 212.

Amplifier 2412 lies in signal path 212 and preferably amplifies the twelfth signal at least 40 dB. It will be clear to those skilled in the art that amplifier 2412, attenuator 2612 and phase-shifter 2512 can lie in signal path 212 in any order.

Splitter 2212 advantageously receives the twelfth signal from signal path 212 and creates a fourteenth signal on signal path 214 and a fifteenth signal on signal path 215 such that both the fourteenth signal and the fifteenth signal are analog representations of the twelfth signal. While it is advantageous that the fourteenth signal and have an amplitude of 30 dB or less lower than the amplitude of the fifteenth signal, it will be clear to those skilled in the art how to make and use embodiments of the present invention in which the fourteenth signal is not 30 dB less than the fifteenth signal.

Delay line 2713 lies in signal path 213 and preferably delays the thirteenth signal for the same duration as the twelfth signal is delayed on signal path 212 and the fourteenth signal is delayed on signal path 214 so that the thirteenth signal on signal path 213 and the fourteenth signal on signal path 214 arrive at combiner 2316 at exactly the same time.

Combiner 2316 receives the thirteenth signal from signal path 213 and the fourteenth signal from signal path 214 and preferably adds them in opposite phase and outputs the sum as the sixteenth signal on signal path 216. It is preferred that attenuator 2612, phase-shifter 2512 and delay-line 2713 be tuned so that the sixteenth signal is an analog representation of the distortion products introduced into the twelfth signal by amplifier 2412.

Attenuator 2616 lies in signal path 216 and preferably modifies the amplitude of the sixteenth signal so that the amplitudes of the distortion in the fifteenth signal on signal path 215 and the sixteenth signal on signal path 216 are equal upon being added in combiner 2317. It will be clear to those skilled in the art that attenuator 2616 can be subsumed into combiner 2316 or combiner 2317.

Phase-shifter 2516 also lies in signal path 216 and preferably modifies the phase of the sixteenth signal so that the phases of the fifteenth signal on signal path 215 and the sixteenth signal on signal path 216 are opposite upon being added in combiner 2317. It will also be clear to those skilled in the art that attenuator 2616 and phase-shifter 2516 can lie in signal path 215 instead of signal path 216.

Amplifier 2416 lies in signal path 216 and preferably amplifies the sixteenth signal at least 50 dB. It will be clear to those skilled in the art that amplifier 2416, attenuator 2616 and phase-shifter 2516 can lie in signal path 216 in any order.

Delay line 2715 lies in signal path 215 and preferably delays the fifteenth signal for the same duration as the fourteenth signal is delayed on signal path 214 and the sixteenth signal is delayed on signal path 216 so that the fifteenth signal on signal path 215 and the sixteenth signal on signal path 216 arrive at combiner 2317 at exactly the same time.

Combiner 2317 receives the fifteenth signal from signal path 215 and the sixteenth signal from signal path 216, adds them in opposite phase and outputs the sum as the seventeenth signal on signal path 217. It is preferred that attenuator 2616, phase-shifter 2516 and delay-line 2715 be tuned so that the seventeenth signal is an analog representation of the distortion products remaining in the tenth signal.

Delay line 2710 lies in signal path 210 and preferably delays the tenth signal for the same duration as the delay in the ninth signal, the eleventh signal, the twelfth signal, the fifteenth signal, and the seventeenth signal so that the tenth signal on signal path 210 and the seventeenth signal on signal path 217 arrive at combiner 2318 at exactly the same time.

Combiner 2318 receives the tenth signal from signal path 210 and the seventeenth signal from signal path 217, adds them in opposite phase and outputs the sum as the output signal on signal path 218. It is preferred that attenuator 2611, phase-shifter 2511 and delay-line 2710 be tuned so that the output signal is an analog representation of the input signal without the distortion products introduced by amplifier 243.

What is claimed is:

1. An amplifier comprising:
   a first splitter (120) for creating a first signal based on an input signal, for putting said first signal onto a first signal path (101), for creating a second signal based on said input signal, and for putting said second signal onto a second signal path (102);
   a second splitter (121) for receiving said first signal from said first signal path (101), for creating a third signal based on said first signal, for putting said third signal onto third signal path (103), for creating a fourth signal based on said first signal, and for putting said fourth signal onto a fourth signal path (104);
   a first amplifier (143) in said third signal path (103) for amplifying said third signal;
   a third splitter (123) for receiving said third signal from said third signal path (103), for creating a fifth signal based on said third signal, for putting said fifth signal onto a fifth signal path (105), for creating a sixth signal based on said third signal, and for putting said sixth signal onto a sixth signal path (106);
   a first combiner (137) for receiving said fourth signal from said fourth signal path (104) and said fifth signal from said fifth signal path (105), for creating a seventh signal based on said fourth signal and said fifth signal, and for putting said seventh signal onto a seventh signal path (107);
   a second amplifier (147) in said seventh signal path (107) for amplifying said seventh signal;
   a second combiner (138) for receiving said sixth signal from said sixth signal path (106) and said seventh signal from said seventh signal path (107), for creating an eighth signal based on said sixth signal and said seventh signal, and for putting said eighth signal onto an eighth signal path (108);
   a fourth splitter (128) for receiving said eighth signal from said eighth signal path (108), for creating a ninth signal based on said eighth signal, for putting said ninth signal onto a ninth signal path (109), for creating a tenth signal based on said eighth signal, and for putting said tenth signal onto a tenth signal path (110);
   a third combiner (1311) for receiving said second signal from said second signal path (102) and said ninth signal from said ninth signal path (109), for creating an eleventh signal based on said second signal and said ninth signal, and for putting said eleventh signal onto an eleventh signal path (111);
   a third amplifier (1411) in said eleventh signal path (111) for amplifying said eleventh signal; and
   a fourth combiner (1312) for receiving said tenth signal from said tenth signal path (110) and said eleventh signal from said eleventh signal path (111), and for creating an output signal based on said tenth signal and said eleventh signal.

2. The amplifier of claim 1 further comprising:
   a first phase-shifter (1511) in said eleventh signal path (111); and
   a second phase-shifter (151) in said first signal path (101).

3. The amplifier of claim 2 further comprising:
   a first attenuator (1611) in said eleventh signal path (111); and
   a second attenuator (161) in said first signal path (101).

4. The amplifier of claim 3 further comprising:
   a first delay line (1710) in said tenth signal path (110); and
   a second delay line (172) in said second signal path (102).

5. An amplifier comprising:
   a first splitter (220) for creating a first signal based on an input signal, for putting said first signal onto a first signal path (201), for creating a second signal based on said input signal, and for putting said second signal onto a second signal path (202);
   a second splitter (221) for receiving said first signal from said first signal path (201), for creating a third signal based on said first signal, for putting said third signal onto third signal path (203), for creating a fourth signal based on said first signal, and for putting said fourth signal onto a fourth signal path (204);
   a first amplifier (243) in said third signal path (203) for amplifying said third signal;
   a third splitter (223) for receiving said third signal from said third signal path (203), for creating a fifth signal based on said third signal, for putting said fifth signal onto a fifth signal path (205), for creating a sixth signal based on said third signal, and for putting said sixth signal onto a sixth signal path (206);
   a first combiner (237) for receiving said fourth signal from said fourth signal path (204) and said fifth signal from said fifth signal path (205), for creating a seventh signal based on said fourth signal and said fifth signal, and for putting said seventh signal onto a seventh signal path (207);
   a second amplifier (247) in said seventh signal path (207) for amplifying said seventh signal;
   a second combiner (238) for receiving said sixth signal from said sixth signal path (206) and said seventh signal from said seventh signal path (207), for creating an eighth signal based on said sixth signal and said seventh signal, and for putting said eighth signal onto an eighth signal path (208);

a fourth splitter (228) for receiving said eighth signal from said eighth signal path (208), for creating a ninth signal based on said eighth signal, for putting said ninth signal onto a ninth signal path (209), for creating a tenth signal based on said eighth signal, and for putting said tenth signal onto a tenth signal path (210);

a third combiner (2311) for receiving said second signal from said second signal path (202) and said ninth signal from said ninth signal path (209), for creating an eleventh signal based on said second signal and said ninth signal, and for putting said eleventh signal onto an eleventh signal path (211);

a fifth splitter (2211) for receiving said eleventh signal from said eleventh signal path (211), for creating a twelfth signal based on said eleventh signal, for putting said twelfth signal onto a twelfth signal path (212), for creating a thirteenth signal based on said eleventh signal, and for putting said thirteenth signal onto a thirteenth signal path (213);

a third amplifier (2412) in said twelfth signal path (212) for amplifying said twelfth signal; and a sixth splitter (2212) for receiving said twelfth signal from said twelfth signal path (212), for creating a fourteenth signal based on said twelfth signal, for putting said fourteenth signal onto a fourteenth signal path (214), for creating a fifteenth signal based on said twelfth signal, and for putting said fifteenth signal onto a fifteenth signal path (215);

a fourth combiner (2316) for receiving said fourteenth signal from said fourteenth signal path (214) and said thirteenth signal from said thirteenth signal path (213), for creating a sixteenth signal based on said thirteenth signal and said fourteenth signal, and for putting said sixteenth signal onto a sixteenth signal path (216);

a fourth amplifier (2416) is said sixteenth signal path (216) for amplifying said sixteenth signal;

a fifth combiner (2317) for receiving said fifteenth signal from said fifteenth signal path (215) and said sixteenth signal from said sixteenth signal path (216), for creating a seventeenth signal based on said fifteenth signal and said sixteenth signal, and for putting said seventeenth signal onto said seventeenth signal path (217); and a sixth combiner (2318) for receiving said tenth signal from said tenth signal path (210) and said seventeenth signal from said seventeenth signal path (217), and for creating an output signal based on said tenth signal and said seventeenth signal.

6. The amplifier of claim 5 further comprising:
a second phase-shifter (151) in said first signal path (101); and
a first phase-shifter (1511) in said eleventh signal path (111).

7. The amplifier of claim 6 further comprising:
a second attenuator (161) in said first signal path (101); and
a first attenuator (1611) in said eleventh signal path (111).

8. The amplifier of claim 7 further comprising:
a second delay line (172) in said second signal path (102); and
a first delay line (1710) in said tenth signal path (110).

* * * * *